United States Patent [19]

Krishnaswamy et al.

[11] Patent Number: 5,233,259
[45] Date of Patent: Aug. 3, 1993

[54] LATERAL FIELD FBAR

[75] Inventors: S. Visvanathan Krishnaswamy; Robert W. Weinert, both of Monroeville; John D. Adam, Murrysville, all of Pa.; John M. Walker, Pasadena, Md.

[73] Assignee: Westinghouse Electric Corp., Pittsburgh, Pa.

[21] Appl. No.: 656,657

[22] Filed: Feb. 19, 1991

[51] Int. Cl.$^5$ ............................................ H01L 41/08
[52] U.S. Cl. .................................. 310/324; 310/322; 310/358; 310/365; 310/366
[58] Field of Search ............... 310/322, 324, 358, 365, 310/366

[56] References Cited

U.S. PATENT DOCUMENTS

| | | | |
|---|---|---|---|
| 3,165,651 | 1/1965 | Bechmann | 310/365 |
| 3,202,846 | 8/1965 | Ballato et al. | 310/365 |
| 4,570,132 | 2/1986 | Driscoll | 310/320 |
| 4,625,138 | 11/1986 | Ballato | 331/56 |
| 4,642,508 | 2/1987 | Suzuki et al. | 310/324 |
| 4,701,661 | 10/1987 | Warner et al. | 310/360 |
| 4,719,383 | 1/1988 | Wang et al. | 310/324 |
| 4,748,367 | 5/1988 | Bloch et al. | 310/343 |
| 4,754,187 | 6/1988 | Kosinski | 310/365 |
| 4,785,232 | 11/1988 | Ballato et al. | 324/56 |
| 4,985,655 | 1/1991 | Jensik et al. | 310/344 |

FOREIGN PATENT DOCUMENTS

| | | | |
|---|---|---|---|
| 0031609 | 2/1983 | Japan | 310/324 |
| 0137318 | 8/1983 | Japan | 310/324 |
| 0153412 | 9/1983 | Japan | 310/324 |

OTHER PUBLICATIONS

"VHF/UHF Composite Resonator on a Silicon Substrate," by M. Kitayama et al., Japanese Journal of Applied Physics, vol. 22, 1983.

"Acoustic bulk wave composite resonators," by K. Lakin et al., Applied Physics Letters, Feb. 1, 1981.

"Stacked Crystal Filters Implemented With Thin Films", K. M. Lakin et al., 43rd Annual IEEE Symposium on Frequency Control-1989.

"A Thin Film Mosaic Transducer for Bulk Waves", R. W. Weinert et al., IEEE Transactions on Sonics and Ultrasonics, vol. SU-19, No. 3, Jul. 1972.

"An Approximate Expression for the Motional Capacitance of a Lateral Field Resonator", R. C. Smythe et al., 41st Annual Frequency Control Symposium-1987.

"LiTaO$_3$ Lateral Field Resonators", S. V. Krishnaswamy et al., IEEE 1989 Ultrasonics Symposium.

"Fundamental-mode VHF/UHF miniature acoustic resonators and filters on silicon" by T. Grudkowski et al., Applied Physics Lett. 37(11), Dec. 1980.

"Lateral-Field Excitation of Quartz Plates" by E. Hatch et al., IEEE Ultrasonics Symposium, Oct. 31, Nov. 1, 2, 1983.

Primary Examiner—Mark O. Budd
Assistant Examiner—Thomas M. Dougherty
Attorney, Agent, or Firm—David G. Maire

[57] ABSTRACT

This invention is a design for lateral field film bulk acoustic resonators (LF-FBAR). All electrodes in this design are located on one surface of the piezoelectric material, thereby simplifying manufacturing and improving performance. The gap between electrodes is limited to a specified dimension to maximize the efficiency of the device. Single and multi-pole devices are described. Barium magnesium fluoride and lithium niobate are specified as the piezoelectric material for high frequency applications.

13 Claims, 3 Drawing Sheets

LATERAL FIELD FBAR

BACKGROUND OF THE INVENTION

Conventional film bulk acoustic resonators (FBAR) are constructed in the configurations shown in FIGS. 1 and 2. In FIG. 1, a metal electrode 1 is disposed on a layer of piezoelectric material 3 having a thickness $T_p$, which in turn is disposed on a thinned section of a semiconductor material 5 having a thickness $T_s$ in the thinned area. A second metal electrode 7 is disposed on the semiconductor material, opposed the piezoelectric material 3. In FIG. 2, the second metal electrode 17 is positioned directly between the piezoelectric material 13 having thickness $T_p$ and the thinned semiconductor material 15 having thickness $T_s$. The first metal electrode 11 is again disposed on the top of the piezoelectric material 13. In both Figures, a voltage applied across the metal electrodes will produce a thickness directed electric field within the piezoelectric material. The bulk acoustic wave generated within the piezoelectric material is usually compressional, since it is easy to grow C-axis oriented zinc oxide (ZnO) or aluminum nitride (AlN) films as the piezoelectric material. A figure-of-merit (FOM) which defines the usefulness of the resonator for band pass filter or voltage controlled oscillator applications is defined as $$FOM = \tfrac{1}{2}Q\frac{C}{C_o} \quad (1)$$

Q is the unloaded quality factor, and the capacity ratio $C/C_o$ is approximated by $$C/C_o \approx [8/\pi^2][k_{eff}^2/N^2] \quad (2)$$

where $k_{eff}^2$ is the effective electromechanical coupling constant of the resonator structure, and N is the number of acoustic half wavelengths in the piezoelectric layer. For a well designed, high frequency, energy trapped resonator, the Q is limited by acoustic attenuation in the piezoelectric layer and the semiconducting layer.

If the two configurations shown in FIGS. 1 and 2 are made of the same materials, the Q will be the same for the two devices. There is, however, a difference in the FOM between the two configurations. This difference comes about because the $k_{eff}^2$ factor of the two is different. It is easy to show that $$k_{eff}^2 = k^2/\{1 + (\epsilon_p T_s/\epsilon_s T_p)\} \quad (3)$$

where $k^2$ is the electromechanical coupling constant of the piezoelectric material, and $\epsilon_p$, $\epsilon_s$, and $T_p$, $T_s$ are the relative dielectric constants and thicknesses of the piezoelectric layer and the substrate, respectively. In equation (3), $T_p$ and $T_s$ have meaning only where the electric field exists, and therefore, for the configuration of FIG. 2, $T_s = 0$. Since $k_{eff}^2$ is larger for FIG. 2 than for FIG. 1, it is the preferred configuration for conventional high FOM resonators. It should be noted the efficiency of the resonators shown in both FIGS. 1 and 2 are also affected by acoustic loss in the metal electrodes 1, 7, 11, and 17.

Conventional multi-pole FBAR filters use either the ladder or stacked configuration. The ladder filter shown in FIG. 3 has two or more resonators electrically coupled to each other. In FIG. 3, the semiconductor substrate 31 has two resonators formed in the manner of the resonator of FIG. 2. In FIG. 3, each resonator has piezoelectric material 33 and 33' disposed between metal electrodes 34, 35 and 34', 35' respectively. Input is provided to electrode 34 while output is obtained at electrode 35'. The two resonators are connected by electrically connecting electrodes 35 and 34'. The ladder filter has the advantage that all of the resonators can be made identical to one another. Non-identical frequency (anharmonic) spurious responses are rejected by the cascade of resonators. In the stacked filter arrangement, shown in FIG. 4, the two resonators are deposited one over the other on a semiconductor substrate 41 with a common ground plane separating them. In FIG. 4, input electrode 42 and output electrode 44 are separated from common ground electrode 43 by piezoelectric layers 45 and 45'. The advantage gained by introducing the middle ground plane is that the input and the output are not coupled electrically. The clamped electrical capacity of the resonator still exists, but it appears between input and ground and between output and ground, and it does not connect input to output. The coupling between the input and output is an acoustic coupling. The resonator in this two-port configuration provides better filtering action than a one port device because there are no non-resonant elements connecting input and output. Further, the two-port arrangement eliminates the need for inductors to tune out the input-output capacitance. These inductors are typically an order of magnitude larger in area than the FBAR and tend to dominate a monolithic filter chip. However, the stacked filter has three metal electrodes layers which complicate manufacturing and which contribute to the acoustic loss of the filter.

SUMMARY OF THE INVENTION

In light of the limitations of existing devices, it is the object of this invention to provide a film bulk acoustic resonator design which has an improved quality factor and figure of merit, and which is less complicated to manufacture than prior art devices.

A lateral field film bulk acoustic resonator (LF-FBAR) is described herein. The input and output electrodes of this device are both located on one surface of a piezoelectric material, which in turn, is supported by a thinned semiconductor material or a dielectric membrane. A multi-pole LF-FBAR is also described wherein a ground electrode is positioned between the input and the output electrodes, thereby electrically isolating the input from the output. The gaps separating the electrodes of these devices are made small in order to maximize the efficiency of the devices. For high frequency applications the piezoelectric material is specified to be barium magnesium fluoride or lithium niobate.

DESCRIPTION OF THE PREFERRED EMBODIMENT

Figure 5:
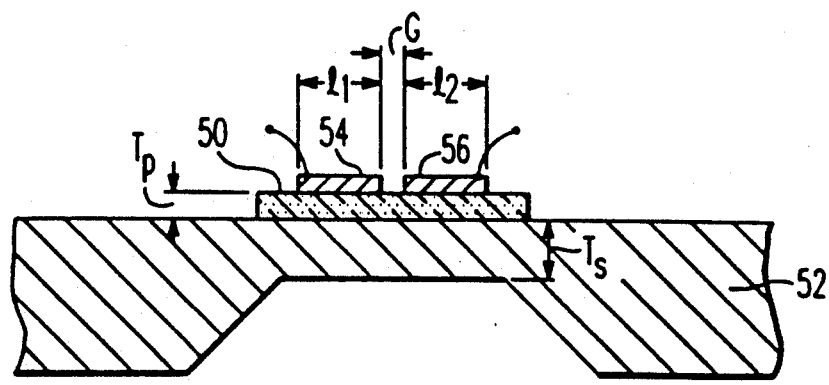
FIG. 5 illustrates one embodiment of this invention, a lateral field FBAR device.

A lateral field film bulk acoustic resonator is shown in FIG. 5, where a piezoelectric film 50 having thickness $T_p$ is disposed on a thinned layer of substrate material 52 having a thickness $T_s$ in the thinned area. The substrate material can be any material which provides a proper Q factor for the resonator, but it is preferably a semiconductor or dielectric material. Two metal electrodes 54, 56 are disposed on the piezoelectric film 50, opposed the thinned section of the semiconductor material 52. The electrodes have lengths $l_1$ and $l_2$ respectively, and each has a width w (not shown) along an axis into the page of the figure. The electrodes 54, 56 are separated by a gap having a width G.

Acoustic wave excitation takes place via the lateral electric field inside the piezoelectric film 50. The lateral field excites shear waves in the piezoelectric material in lieu of the compression waves generated in FIG. 2. Since shear acoustic attenuation is less than compression acoustic attenuation, the lateral field device will have a higher Q potential. In addition, the lateral field configuration has only one metal film in the acoustical path, thus any reduction in Q due to a second metal electrode is eliminated. Furthermore, the device of FIG. 5 requires fewer processing steps than the device of FIG. 2, since the second metal layer is eliminated. Therefore, the LF-FBAR of FIG. 5 satisfies the objects of this invention.

Figure 6:
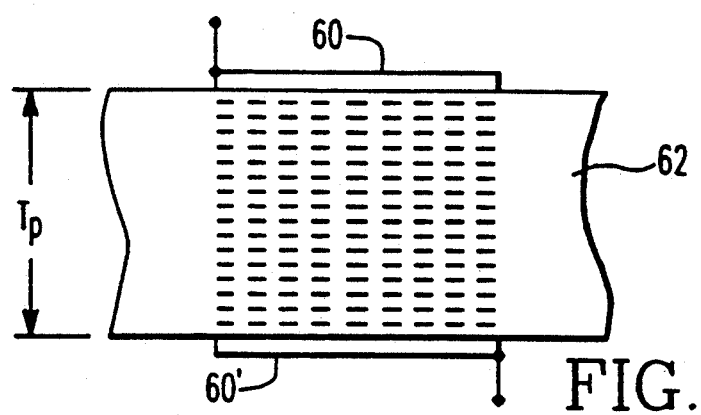
FIG. 6 illustrates a prior art conventional thickness field resonator.

Further improvement in the efficiency of the LF-FBAR device can be achieved by limiting the size of the gap which separates the electrodes. To understand the advantage of a small gap lateral field FBAR, we first examine an $N^{th}$ harmonic conventional thickness field resonator, as shown in FIG. 6. Metal electrodes 60, 60' are disposed on a piezoelectric crystal 62 having thickness $T_p$ which is N acoustic half wavelengths. The electric field produced throughout the crystal thickness by the voltage potential between the electrodes 60, 60' is effective for producing acoustic strain in only the first half acoustic wave length when N is odd. For the rest of the volume there is an even number of half wave lengths and the electric field leads to no net excitation over this volume. The effective electro-mechanical coupling constant, which is a measure of conversion of electrical energy to acoustic energy is $$k_N^2 = \frac{k_o^2}{N^2} \tag{4}$$

where $k_o^2$ is the coupling constant of the piezoelectric material for fundamental mode thickness field excitation. Thus, the effective coupling constant is inversely proportional to the square of the order of harmonic and the efficiency of this device decays rapidly as the order of harmonic increases.

Figure 7:
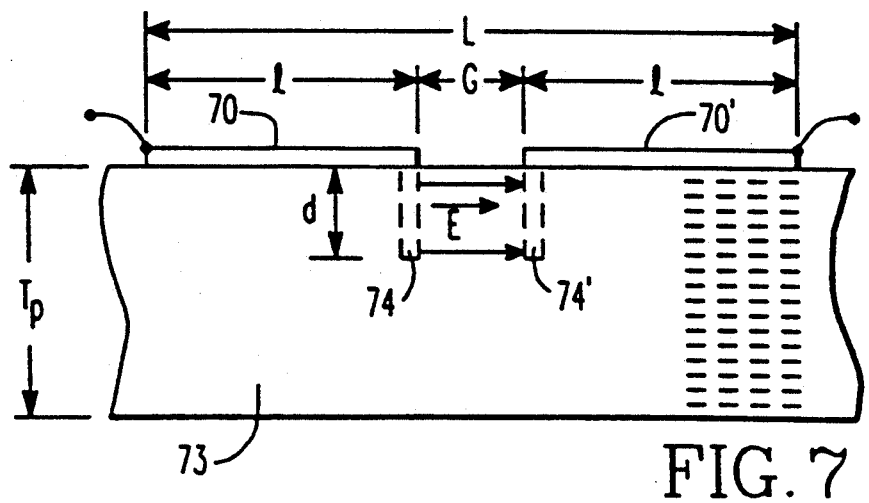
FIG. 7 illustrates a lateral field resonator with equivalent electrodes used to approximate the electric field distribution.

We now describe a lateral field, Nth harmonic resonator which has an effective coupling constant much larger than $k_2{}^o/N^2$. FIG. 7 shows a set of lateral field electrodes 70, 70', of length 1, separated by a gap of length G, disposed on a piezoelectric crystal 73 having thickness $T_p$ which is N acoustic half wavelengths. The electrical capacity of the lateral field electrodes can be calculated precisely, but for this discussion we assume that the capacity of the electrodes is equivalent to the capacity of the imaginary parallel plate structure 74, 74' shown in phantom in FIG. 7 where the length of the imaginary plates is shown as dimension d. In this structure, $$d = \sqrt{\frac{Gl}{3}} \text{ for } 1 < T_p \text{ and } d = \sqrt{\frac{GT}{3}} \text{ for } 1 \geq T_p. \tag{5}$$

The uniform lateral electric field of this equivalent capacitor is assumed to be approximately equal to the lateral electric field of the original electrodes. The electric field is also assumed to be uniform over $(d/T_p)$ N acoustic half waves, and the effective coupling constant is $$k_N^2 = \frac{K_o^2}{\left[\frac{d}{T_p} N\right]^2} \tag{6}$$

where $K_o^2$ is the coupling constant of the piezoelectric material for fundamental mode lateral field excitation. For $1 < T_p$ the effective coupling constant becomes $$k_N^2 = \frac{3T_p^2}{Gl} \frac{K_o^2}{N^2} \tag{7}$$

Writing Tp as $N\frac{\Lambda}{2}$, where $\Lambda$ is the acoustic wavelength of the Nth harmonic wave, and choosing $G = 1 = \Lambda \sqrt{3/4}$, the effective coupling constant for the Nth harmonic becomes $$k_N^2 = K_o^2 \tag{8}$$

Figure 8A:
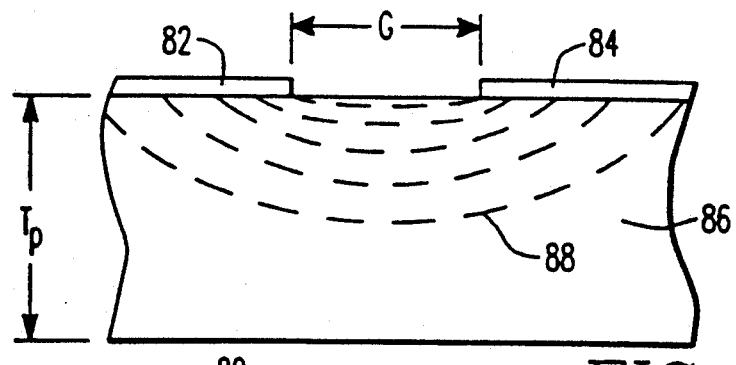
FIGS. 8A and 8B illustrate the difference in electric field distribution between a large gap and a small gap lateral field resonator.
Figure 8B:
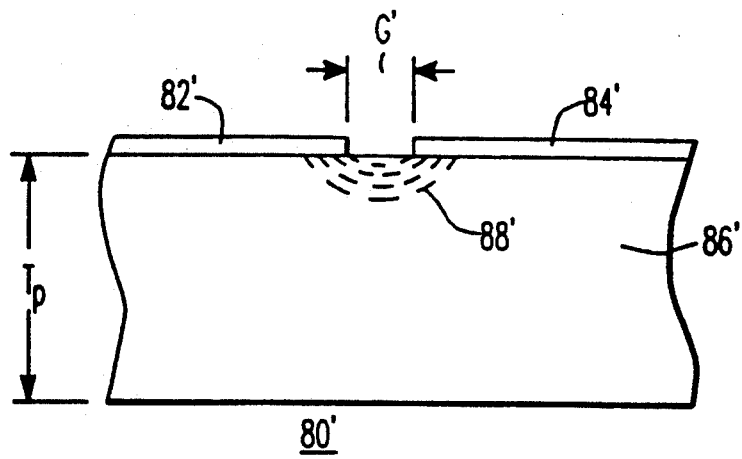

That the coupling of the Nth harmonic can be made as large as that of the fundamental is a consequence of the electric field flux distribution of small gap lateral field electrodes. This phenomenon is illustrated in FIGS. 8A and 8B. Structure 80 of FIG. 8A represents a resonator with electrodes 82, 84 separated by a relatively large gap of dimension G, disposed on a piezoelectric crystal 86. Structure 80' of FIG. 8B represents a similar resonator with a small gap. The electric field distribution is represented by the density of lines 88, 88'. The electric field is strongest in the areas nearest to the electrodes, and it decays non-linearly therefrom. Where the electrode gap is large in relation to the thickness of the crystal, as in FIG. 8A, the volume of crystal which receives sufficient electric field energy to generate a significant piezoelectric effect is numerous half wavelengths deep from the top of the crystal. If, however, the gap is small in relation to the crystal thickness, as in FIG. 8B, the volume of crystal which is significantly involved in the piezoelectric effect can be limited to a small number of half wavelengths in depth.

A gap size can be defined for the device in FIG. 5 which will limit the equivalent capacitor and its uniform lateral electric field to the depth of the piezoelectric material 50 for fundamental mode operation. For electrode lengths greater than or equal to $T_p + T_s$ the capacity of the top metal electrodes is approximately $$c = \epsilon_p dW/G \tag{9}$$

From equation 5 above we see that $$d^2 \approx \frac{G(T_p + T_s)}{3} \quad (10)$$

Then to limit the equivalent capacitor depth d to the thickness of the piezoelectric material, we set $d = T_p$, and solve equation 10 for the gap dimension, yielding $$G = 3T_p^2/(T_p+T_s) \quad (11)$$

Figure 1:
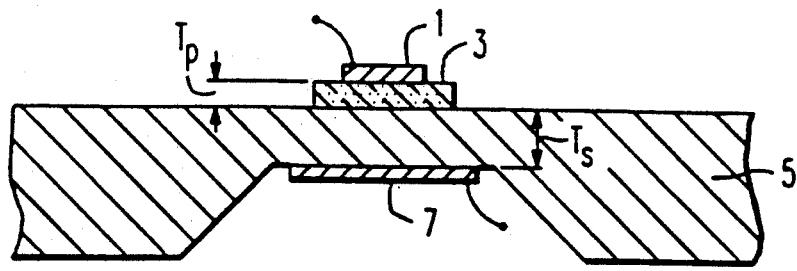
FIGS. 1–4 illustrate prior art FBAR devices.
Figure 2:
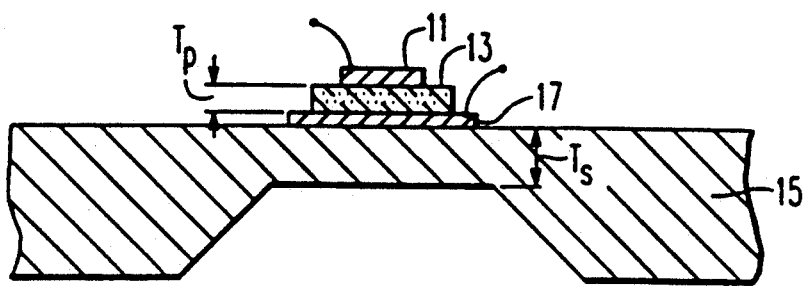
Figure 3:
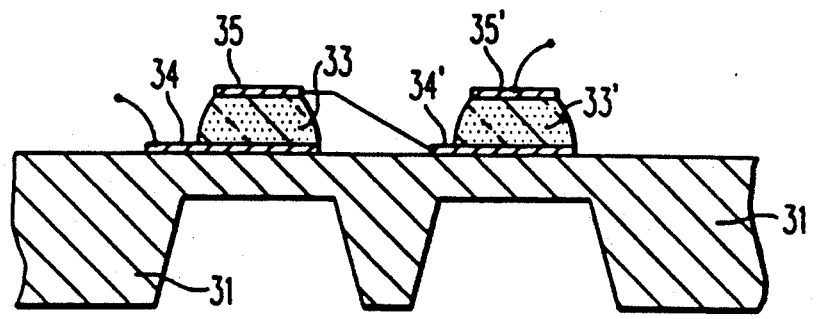
Figure 4:
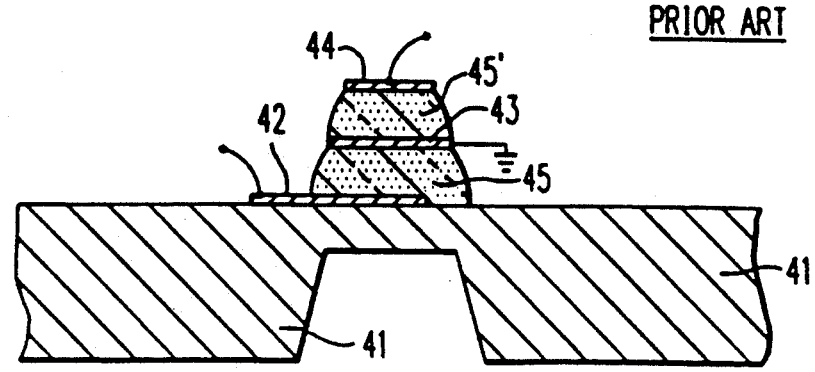

Therefore $k_{eff}$ for this structure is the same as that of FIG. 2 and the figure of merit is as large as it can be for a given $T_p$ in fundamental mode operation. The gap size can be made even smaller to optimize the device efficiency in harmonic operation above the fundamental mode, as taught in commonly assigned copending application Ser. No. 07/607,419 by Weinert et al. entitled "Lateral Field HBARs".

Therefore, it has been disclosed that the efficiency of an LF-FBAR device will improve as the size of the gap between the electrode is made smaller. For a device operating at the fundamental mode frequency, typically microwave frequencies for many applications, the coupling efficiency can be optimized by maintaining the gap size less than or equal to approximately $3T_p^2/(T_p+T_s)$. For devices operating at frequencies above the fundamental frequency, gap sizes even less than $3T_p^2/(T_p+T_s)$ will result in further improvement in device efficiency.

Figure 9:
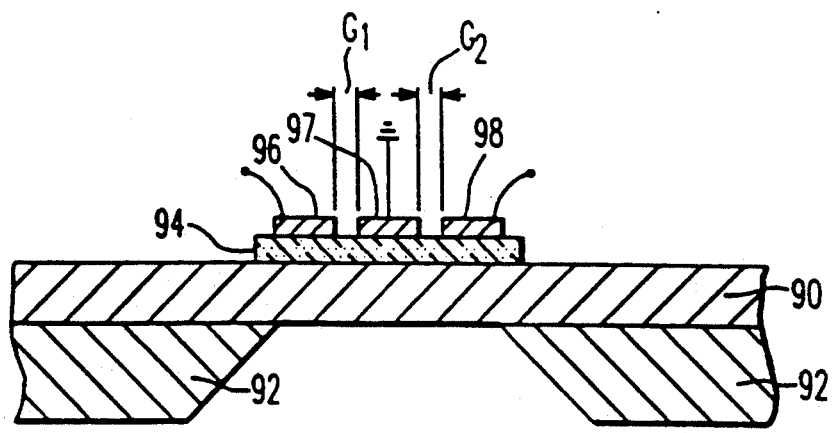
FIG. 9 illustrates one embodiment of this invention, a multi-pole lateral field FBAR device, in which a grounded electrode prevents direct capacitive coupling between the input and output electrodes.

A multi-pole device can also be made with the lateral field configuration, as shown in FIG. 9. In FIG. 9, a substrate 90, preferably a dielectric material, is disposed over an opening in a semiconductor material 92. Piezoelectric material 94 is disposed on the dielectric substrate opposed the opening in the semiconductor material 92. Metal electrodes 96, 97, 98 are disposed on the piezoelectric material 94. The input electrode 96 and output electrode 98 are separated from the common ground electrode 97 by gaps with dimensions $G_1$ and $G_2$ respectively. This device has all of the advantages of a conventional stacked FBAR, but it requires only one layer of metalization for the electrodes, thereby simplifying fabrication and eliminating the acoustic loss caused by the additional metal layers. Here again, the smaller the electrode gaps, the more efficient the device will be. By limiting each of the electrode gaps to the valve of equation 11 above, the efficiency of this device can be optimized.

The devices shown in FIGS. 5 and 9 can be made by using deposition and etching techniques which are well known in the art. The semiconductor material is preferably silicon or gallium arsenide. The metal electrodes are preferably aluminum or gold. The material used for the piezoelectric layer is traditionally ZnO or AlN, however, to maintain reasonable Q values at high frequencies (>1 GHz), piezoelectric film materials that are less acoustically lossy than these materials must be used. Table 1 summarizes relevant acoustic properties of selected piezoelectric materials.

TABLE 1

Relevant Acoustic Properties of Selected Materials

| Material | Density (kg/cm$^3$) | Dielectric Constant | Velocity (m/s) | Impedance ($10^6$kg/m$^2$s) | Coupling Constant (k) | Loss (dB/$\mu$s) at 1 GHz |
|---|---|---|---|---|---|---|
| ZnO | 5680 | 8.8 | 6330 (2720) | 36 (15) | 0.28 (0.32) | 8.3 |
| AlN | 3270 | 8.5 | 10400 | 34 | 0.17 | ~5 |
| LiNbO$_3$ | 4640 | 29 (44) | 7320 (4800) | 30.58 (22.6) | 0.17 (0.68) | 0.3 |
| BaMnF$_4$ | 4650 | 7$\epsilon_c$ 11–15$\epsilon_a,\epsilon_b$ | 4950 (1930) | 23 | 0.255 | 1.5 |
| Al$_2$O$_3$ (100) | 3970 | 10 | 11130 | 44.34 | — | 0.45 |
| MgAlO$_4$ | 3780 | — | 8800 | 33.26 | — | .16–.76 |

Values presented in the parentheses refer to shear mode excitation

As can be seen from the table, barium magnesium fluoride and lithium niobate are preferred because they are less lossy as well as having higher acoustic coupling constants than the ZnO or AlN. Moreover, using appropriate dielectric buffer layers, epitaxial films of these materials can be grown on semiconductor substrates, thereby having higher crystal quality and lower acoustic loss than if grown onto a lower metal electrode. Spinel (magnesium aluminosilicate) and sapphire (aluminum oxide) exhibit good dielectric properties and low acoustic loss when used as buffers. These materials can also act as the supporting dielectric substrate 90 for the resonator structure, as shown in FIG. 9. For such structures, $T_s$ in equation 11 above refers to the thickness of the dielectric substrate 90.

We claim:

1. A lateral field film bulk acoustic resonator comprising:
   piezoelectric means operable to transform electrical energy to acoustic energy, said piezoelectric means having a thickness $T_p$;
   substrate means operable to support said piezoelectric means, said substrate means having a thickness $T_s$;
   at least two electrodes disposed on one surface of said piezoelectric means, said electrodes coupled by lateral excitation of said piezoelectric means,
   wherein said electrodes are separated by a gap no greater than $3T_p^2/(T_p+T_s)$.

2. A lateral field film bulk acoustic resonator as in claim 1, wherein said piezoelectric means is barium magnesium fluoride.

3. A lateral field film bulk acoustic resonator comprising:
   piezoelectric means operable to transform electrical energy to acoustic energy, said piezoelectric means having a thickness $T_p$;
   substrate means operable to support said piezoelectric means, said substrate means having a thickness $T_s$;
   an input electrode, an output electrode, and a ground electrode disposed on one surface of said piezoelectric means, said ground electrode being disposed between said input and output electrodes.

4. A lateral field film bulk acoustic resonator as in claim 3, wherein the gaps separating said ground electrode from said input and said output electrodes each have a dimension no greater than $3T_p^2/(T_p+T_s)$.

5. A lateral field film bulk acoustic resonator as in claim 3, wherein said piezoelectric means is barium magnesium fluoride or lithium niobate.

6. A lateral field film bulk acoustic resonator comprising:
- a dielectric substrate having a thickness $T_s$ disposed on a layer of semiconductor material and spanning an opening in said semiconductor material;
- a piezoelectric layer having a top surface, a bottom surface, and a thickness $T_p$, said bottom surface disposed on said dielectric substrate opposed said opening in said semiconductor material;
- an input electrode and an output electrode disposed on said top surface of said piezoelectric layer,
- further comprising said input electrode and said output electrode being coupled by lateral field excitation of said piezoelectric layer.

7. A lateral field film bulk acoustic layer as in claim 6, wherein said input and output electrodes are separated by a gap having a dimension no greater than $3T_p^2/(T_s+T_p)$.

8. A lateral field film bulk acoustic resonator as in claim 6, wherein said piezoelectric layer is barium magnesium fluoride or lithium niobate.

9. A lateral field film bulk acoustic resonator as in claim 6, wherein said dielectric substrate is spinel or sapphire.

10. A lateral field film bulk acoustic resonator comprising:
- a dielectric substrate having a thickness $T_s$ disposed on a layer of semiconductor material and spanning an opening in said semiconductor material;
- a piezoelectric layer having a top surface, a bottom surface, and a thickness $T_p$, said bottom surface disposed on said dielectric membrane opposed said opening in said semiconductor material.
- an input electrode, an output electrode and a ground electrode disposed on said top surface of said piezoelectric layer, said ground electrode being disposed between said input and output electrodes.

11. A lateral field film bulk acoustic resonator as in claim 10, wherein the gaps separating said ground electrode from said input and said output electrodes each have a dimension no greater than $3T_p^2/(T_p+T_s)$.

12. A lateral field film bulk acoustic resonator as in claim 10, wherein said piezoelectric layer is barium magnesium fluoride or lithium niobate.

13. A lateral field film bulk acoustic resonator as in claim 10, wherein said dielectric substrate is spinel or sapphire.

* * * * *